United States Patent [19]

Tomita et al.

[11] Patent Number: 4,752,712
[45] Date of Patent: Jun. 21, 1988

[54] PIEZOELECTRIC LAMINATE STACK

[75] Inventors: Masahiro Tomita, Anjo; Eturo Yasuda, Okazaki; Akio Iwase, Nishio, all of Japan

[73] Assignee: Nippon Soken, Inc., Nishio, Japan

[21] Appl. No.: 935,637

[22] Filed: Nov. 25, 1986

Related U.S. Application Data

[63] Continuation of Ser. No. 743,355, Jun. 10, 1985, abandoned.

[51] Int. Cl.$^4$ ............................................. H01L 41/08
[52] U.S. Cl. .................................... 310/328; 310/365; 310/366; 29/25.35
[58] Field of Search ............... 310/328, 365, 366, 353; 29/25.35

[56] References Cited

U.S. PATENT DOCUMENTS

| | | | |
|---|---|---|---|
| 3,501,099 | 3/1970 | Benson | 310/328 X |
| 4,011,474 | 3/1977 | O'Neill | 310/328 |
| 4,384,230 | 5/1983 | Wisner | 310/328 X |
| 4,460,842 | 7/1984 | Waanders et al. | 310/328 X |
| 4,471,256 | 9/1911 | Igashra et al. | 310/328 |
| 4,499,566 | 2/1985 | Abbott | 310/366 X |

FOREIGN PATENT DOCUMENTS 0141812 11/1980 Japan ................................... 310/353

OTHER PUBLICATIONS

Double Mount for Each Electrode of Crystal to Prevent Failure, by E. C. Thompson, *Western Electric Technical Digest*, No. 26, Apr. 1972, pp. 59 and 60.

Primary Examiner—Mark O. Budd
Attorney, Agent, or Firm—Cushman, Darby & Cushman

[57] ABSTRACT

A piezoelectric laminate stack having a plurality of piezoelectric plates manufactured of a piezoelectric element, and a plurality of metal plates. The metal plates have approximately the same shape as the piezoelectric plates, and are formed with at least two projections, respectively, on the periphery thereof. The length of the projections is greater than the thickness of the piezoelectric plates. The piezoelectric plates and the metal plates are alternately stacked. The projections of a first group of metal plates are located at angular positions different to angular positions of the projections of a second group of metal plates. The projections are bent in a direction along the axis of the laminate stack in such a manner that the first group of metal plates are electrically connected together and the second group of the metal plates are electrically connected together.

9 Claims, 3 Drawing Sheets

PIEZOELECTRIC LAMINATE STACK

This is a continuation of application Ser. No. 743,355, filed June 10, 1985, which was abandoned upon the filing hereof.

BACKGROUND OF THE INVENTION

1. Field of the Invention

The present invention relates to a piezoelectric laminate stack constructed by laminating a plurality of plate members made of a piezoelectric element, which expand and contract according to an electric voltage applied thereon to operate as an actuator.

2. Description of the Related Art

A conventional piezoelectric laminate stack comprises piezoelectric circular disk-type plates having electrodes formed on both faces, and metal plates approximately the same shape as the piezoelectric plates having one projection on its periphery, as proposed by U.S. patent application No. 621,624. The piezoelectric plates and metal plates are stacked alternately, and in such a manner that the projections of each metal plate lie in a direction opposite to that of the projections formed on the metal plate positioned adjacent thereto. Each projection is electrically connected to another projection positioned alternately to the former projection, and positive or negative electrodes are connected to each projection. In such a piezoelectric laminate stack, however, since the piezoelectric plates can displace in a radial direction relative to the metal plates, it is difficult to keep the stack in its proper formation and operation becomes difficult unless the stack is housed in a housing immediately after stacking is completed, or the stack is formed directly in the housing. In these cases, the piezoelectric plates used for this conventional piezoelectric stack body must be previously polarized, raising the production cost of the stack. Further, while this kind of piezoelectric stack is usually subjected to a high voltage, to obtain a larger displacement of the stack, two adjacent metal plates may come to face each other without the insulation provided by the piezoelectric plates, as these piezoelectric plates are displaced in a radial direction, and thus an empty gap is formed between the two metal plates and an electrical discharge occurs between the poles of the metal plates.

SUMMARY OF THE INVENTION

An object of the present invention is to provide a piezoelectric laminate stack in which the stacked formation of the laminate stack is easily maintained during assembly, and polarization can be carried out after stack assembly.

Another object of the present invention is provide a piezoelectric laminate stack in which an electrical discharge will not occur between the metal plates when a high voltage is applied.

According to the present invention, there is provided a piezoelectric laminate stack comprising a plurality of piezoelectric plates and a plurality of metal plates. The piezoelectric plates are manufactured from piezoelectric elements. The metal plates have approximately the same shape as the piezoelectric plates, and are formed with at least two projections on the periphery thereof. The length of the projections is greater than the thickness of the piezoelectric plates. The piezoelectric plates and the metal plates are stacked alternately in the laminate stack. The metal plates are classified into first and second groups, the first group of metal plates and the second group of metal plates being stacked alternately. The projections of the first group of metal plates project in a different direction to the projections of the second group of metal plates. The projections of the first and second group of metal plates are bent in the direction of the axis of the laminate stack and connected to adjacent projections of the same group of metal plates. Thus, the first group of metal plates are electrically connected together and are provided with a positive electrode, and the second group of metal plates are electrically connected together and are provided with a negative electrode.

BRIEF DESCRIPTION OF THE DRAWINGS

The present invention will be better understood from the ensuing description made, by way of example, of the embodiments of a piezoelectric laminate stack according to the present invention, with reference to the accompanying drawings wherein.

DESCRIPTION OF THE PREFERRED EMBODIMENTS

The present invention will now be described with reference to the preferred embodiments.

Figure 1:
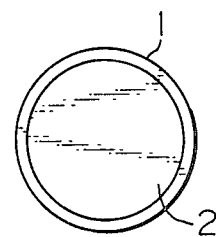
FIG. 1 is a plan view of a piezoelectric plate.
Figure 2:
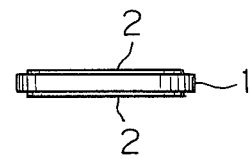
FIG. 2 is a side view of the piezoelectric plate of FIG. 1.
Figure 3:
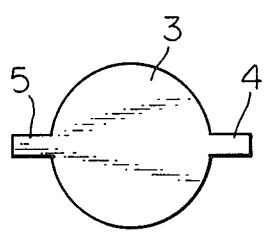
FIG. 3 is a plan view of a metal plate.

FIGS. 1 through 5 show a first embodiment of the present invention. As shown in FIGS. 1 and 2, a piezoelectric plate 1 manufactured by forming a piezoelectric element into a disk shape is 15 mm in diameter and about 0.5 mm in thickness, both the faces of the plate 1 being formed with silver electrodes 2, which are concentric to the piezoelectric plate 1 and are 13 mm in diameter and between 3 and 15 microns in thickness. As shown in FIG. 3, a metal plate 3 is 13 mm in diameter and about 50 microns in thickness, the outer periphery of the metal plate 3 having two rectangular projections 4 and 5 formed thereon. The projections 4 and 5 face outward in a radial direction, and extend in opposite directions, both the projections 4 and 5 being about 1 mm in breadth and about 3 mm in length.

Figure 4:
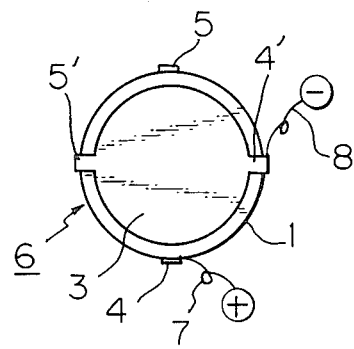
FIG. 4 is a plan view of a laminate stack.
Figure 5:
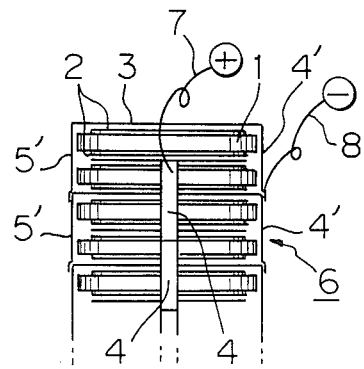
FIG. 5 is a side view of the laminate stack of FIG. 4.

The piezoelectric plates 1 and metal plates 3 are alternately piled or stacked one on top of the other in such a manner that a laminate stack 6 is formed. The projections 4 and 5 of each metal plate 3 are located in positions such that they are displaced by 90° with respect to the other projections 4' and 5' of the adjacent metal plate 3, as shown in FIG. 4. That is, the metal plates 3 are stacked in such a manner that the projections 5 and 4 and 4' and 5' thereof are located alternately at 0° and 180° and at 90° and 270°, respectively, when seen from the top of the laminate stack 6 as shown in the drawing; that is, the first plate projections 5 and 4 are at 0° and 180° and the succeeding plate projections 4' and 5' are at 90° and 270°, and so on alternately when 0° is at 12 o'clock and the reading is clockwise. As shown in FIG. 5, these projections 4 and 5 are bent in the axial direction of the laminate stack 6, to face the outer peripheries of the piezoelectric plates 1 with a clearance of about 0.1 mm, and are located on each adjacent metal plate 3 and on each alternate metal plate 3, respectively. The laminate stack 6 formed by the piezoelectric plates 1 and the metal plates 3 has an axial length of about 40 mm and a diameter of 16 mm. It should be noted that the space between each piezoelectric plate 1 and metal plate 3 as shown in FIG. 5 is to illustrate the construction of the stack 6 in an easily understandable manner. In practice, the piezoelectric plates 1 and the metal plates 3 are in close contact with each other.

As described above, the projections 4 and 5 of each metal plate 3 are in contact with the projections 4' and 5' of the adjacent metal plate 3 in the stack. These projections 4, 5, 4' and 5' are connected together by spot welding while pressing both end faces of the laminate stack 6 in the axial direction at a pressure of between 1 to 10 kg. This action also brings the silver electrodes 2 formed on the piezoelectric plates 1 into close contact with the metal plates 3, so that the silver electrodes 2 and the metal plates 3 are electrically connected to each other, and the projections formed on the metal plates 3 are electrically connected to the projections formed on the adjacent metal plate 3. A lead wire 7 connected to a positive electrode of a power source (not shown) is attached by welding or soldering to the first group of the projections 4 aligned along the axis of the laminate stack 6, and a lead wire 8 connected to a negative electrode of a power source (not shown) is attached by welding or soldering to the second group of projections 4', which are displaced by 90° about the axis of the laminate stack 6 with respect to the first group of projections 4.

The piezoelectric laminate stack 6 constructed as described above expands or contracts by between 60 and 90 microns in the axial direction of the laminate stack when a voltage of between 500 and 700 V is applied at both end faces thereof, so that the piezoelectric laminate stack acts as an actuator. During this expanding or contracting action, since each laminate plate 1 is supported by the projections 4, 4', 5, 5' from four directions and positioned at a constant interval, no relative displacement between the piezoelectric plate 1 and the metal plate 3 occurs in the piezoelectric laminate stack 6. Therefore, even if the piezoelectric laminate stack 6 receives a large mechanical force such as an impact or vibration, the adjacent metal plates 3 will not face each other directly and thus an electrical discharge will not occur.

Since the piezoelectric laminate stack 6 according to this embodiment is formed in one body, the laminate stack 6 is compact and easy to handle. Further, the piezoelectric plates 1 in the piezoelectric laminate stack 6 need not be polarized individually, but can be easily polarized after the piezoelectric plates 1 are assembled in the laminate stack 6 by applying a high voltage of between 0.5 to 2 kV to the lead wires 7 and 8 for a period of between 10 and 60 minutes while dipping the laminate stack 6 in silicon oil at a temperature of between 20° C. and 100° C., greatly reducing the manufacturing cost.

Figure 6:
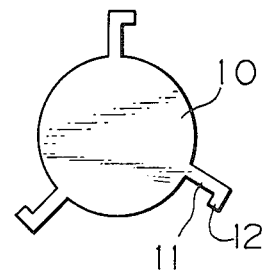
FIG. 6 is a plan view of a metal plate of a second embodiment.
Figure 7:
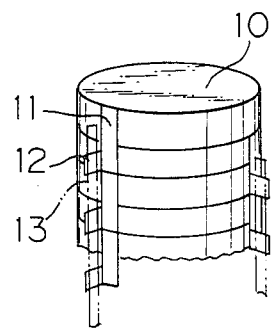
FIG. 7 is a perspective view of a laminate stack provided with the metal plates of the second embodiment.

FIG. 6 shows a metal plate 10 according to a second embodiment of the present invention. This metal plate 10 has three projections 11 on the periphery thereof at intervals of 120 degrees. Each projection 11 extends outward in a radial direction of the metal plate 10 and the tip portions 12 thereof extend in a circumferential direction, so that the projections 11 are approximately L-shaped as a whole. Although the manufacturing process for the laminate stack using the metal plates 10 in the second embodiment is basically the same as the process for the laminate stack according to the above first embodiment, the treatment of the projections 11 is different from that of the projections 4 and 5 of the first embodiment. That is, after alternately stacking the metal plates 10 and the piezoelectric plates 1, the projections 11 are bent by 90° in the axial direction, and the tip portions 12 are then bent radially outward by 90°, as shown in FIG. 7 so as to be disposed in respective straight lines. A metal ribbon 13, 1 mm wide, 40 mm long, and 50 microns thick, is adhered to the bent tip portions 12 by spot welding, and then the tip portions 12 are restored to their original state.

According to the second embodiment, spot welding for connecting the projections 11 becomes easy, since the number of projections 11 is greater than the number of projections 4 and 5 of the first embodiment, and relative displacement between the piezoelectric plate 1 and the metal plate 10 is completely prevented. Therefore, when an electrical voltage is applied to the piezoelectric laminate stack 6, the peripheral portion at both ends of the piezoelectric plate 1 does not suffer stress caused by the projections, thus preventing the plate 1 from cracking. Since a large number of projections 11 are provided, heat generated in the piezoelectric plate 1 by dielectric loss is almost completely dissipated by conduction. Where the outer surface of the laminate stack 6 is isolated by a flexible tube made of polytetrafluoroethylene, the possibility of the piezoelectric plate 1 and the flexible tube coming into close contact with each other is reduced, since the relative displacement between the piezoelectric plate 1 and the flexible tube generated when the laminate stack 6 expands or contacts is eliminated. Also, since the shear force generated in the flexible tube can not act on the piezoelectric plate 1, the piezoelectric plate 1 is protected from cracking.

Figure 8:
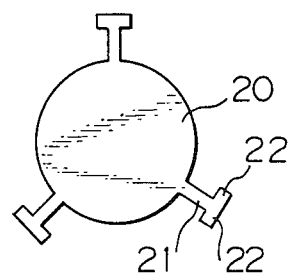
FIG. 8 is a plan view of a metal plate of a third embodiment.

FIG. 8 shows a metal plate 20 according to a third embodiment of the present invention. The metal plate 20 has three projections 21 similar to those of the metal plate 10 of the second embodiment. In this third embodiment, however, the tip portions 22 of the projections 21 extend each side of the projections 21 in the circumferential direction, i.e., the projections 21 are approximately T-shaped. The connection and operations of this third embodiment are similar to the above second embodiment.

Figure 9:
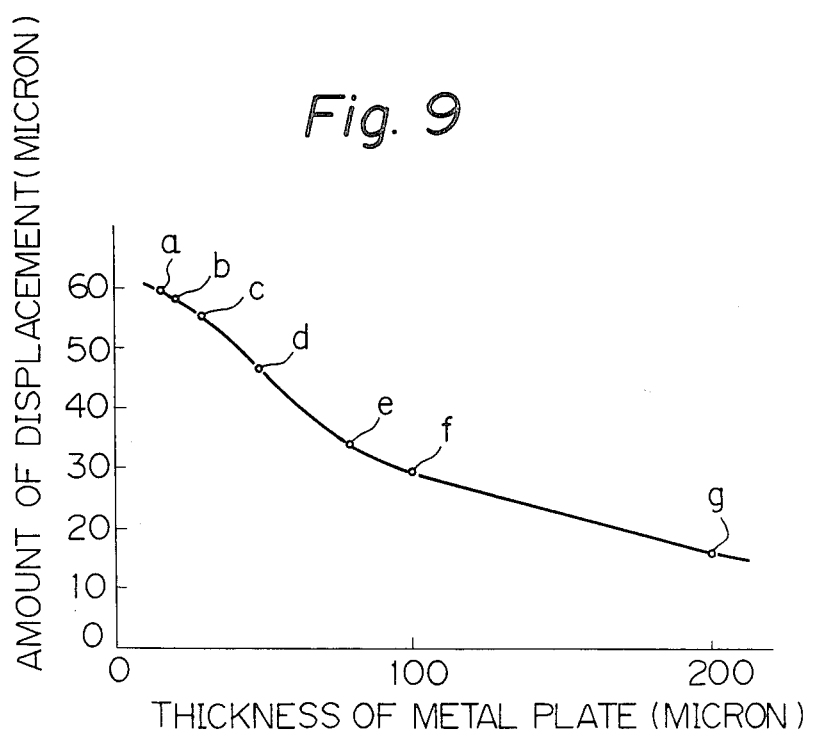
FIG. 9 is a graph showing a displacement of a laminate stack with respect to a variation of the thickness of a metal plate.

FIG. 9 shows variations in the displacement of the laminate stack 6 when the thickness of the metal plate is varied. The curve showing variation in the amount of displacement was obtained by experiments in which a load of about 50 kg was applied to the laminate stack 6. The voltage applied to the laminate stack 6 was about 500 V. In the drawing, reference symbols a, b, c, d, e, f, and g show the amount of displacement in cases in which the thickness of the metal plate was 15, 20, 30, 50, 80, 100, and 200 microns, respectively. Note, the number of projections of the metal plates used were two, therefore, the construction of the laminate stack was basically the same as the construction of the first embodiment. Referring to FIG. 9, it can be understood that the thinner the thickness of the metal plate, the more the laminate stack expands or contracts.

The inventors manufactured a piezoelectric laminate stack having basically the same construction as in the first embodiment, but without the electrode 2 on each piezoelectric plate 1, and the inventors then measured the displacement of the laminate stack 6 by applying 500 volts thereto. As a result, the displacement was less than that of the first embodiment by about 15 microns. Thus, if the piezoelectric plate 1 does not have an electrode, where the piezoelectric laminate stack 6 is used as an actuator, the hysteresis relationship between voltage and displacement is small because there is no cushion function of the electrode when a large load acts on the laminate stack 6. Therefore, if the piezoelectric laminate stack 6 is used as an actuator, control can be carried out with a high accuracy. Thus, in the case of the piezoelectric laminate stack 6 having a piezoelectric plate 1 formed without an electrode, if the piezoelectric plate 1 is made in such a manner that it has very smooth, plain surfaces, and the piezoelectric laminate stack 6 is operated by applying a relatively high load, a sufficiently large displacement is obtained.

Note, that while the piezoelectric plate 1 used in the respective embodiments is made by mixing $Pb(Co_{\frac{1}{3}}Nb_{\frac{2}{3}})O_3$, $Pb(Zn_{\frac{1}{3}}Nb_{\frac{2}{3}})O_3$, $Pb(Ni_{\frac{1}{3}}Nb_{\frac{2}{3}})O_3$ in the form of solid solution to $PbTiO_3$, $PbZrO_3$, or by doping $Nb_2O_5$, $WO_3$ to $PbTiO_3$, $PbZrO_3$, any plate showing a piezoelectric effect can be used. A material which has large $d_{33}$ coefficient is suitable for the piezoelectric plate.

Although embodiments of the present invention have been described herein with reference to the attached drawings, many modifications and changes may be made by those skilled in this art without departing from the scope of the invention.

We claim:

1. A piezoelectric laminate stack comprising:
   a plurality of piezoelectric plates manufactured of a piezoelectric material, each being of an approximately like shape and thickness,
   a plurality of metal plates each having approximately the same shape as said piezoelectric plates, and each being formed with at least three projections on the periphery thereof, the length of each of said projections being greater than the thickness of each of said piezoelectric plates,
   said piezoelectric plates and metal plates being alternately stacked in said stack, said metal plates being classified into a first group and a second group, plates of said first group of metal plates and plates of said second group of metal plates being alternately stacked in said stack,
   said three projections of each plate of said first group of metal plates being spaced from one another about the periphery of the respective said plate and projecting in three different directions, and said three projections of each plate of said second group of metal plates projecting in three different directions, the three different directions in which the projections of the metal plates in the first group project all being different from the three different directions in which the projections of the metal plates in the second group project, said projections of said first and second groups of metal plates being bent from the respective said directions, into a direction which extends in a straight line parallel to the longitudinal axis of said laminate stack and being connected to respective projections of adjacent plates in the same group of metal plates, so that in said first group the respective said metal plates are independently electrically connected together by all three said projections of each respective said plate and provided with a positive electrode, and in said second group the respective said metal plates are independently electrically connected together by all three said projections of each respective said plate and provided with a negative electrode;
   respective said projections of adjacent plates in the same group of metal plates, where they are electrically connected to one another, also being mechanically connected to one another throughout said stack, while said stack is held in an axially compressed condition, so that said stack is maintained in axial compression by the resulting at least six straight lines of mechanically interconnected ones of said projections, which at least six straight lines are spaced about the periphery of the stack.

2. A piezoelectric laminate stack according to claim 1, wherein said projections are rectangular.

3. A piezoelectric stack body according to claim 1, wherein tip portions of said projections extend in a circumferential direction so that said projections are L-shaped.

4. A piezoelectric laminate stack according to claim 1, wherein tip portions of said projections extend in both circumferential directions so that said projections are T-shaped.

5. A piezoelectric laminate stack according to claim 1, wherein the thicknesses of said metal plates are less than 100 microns.

6. A piezoelectric laminate stack according to claim 1, wherein the faces of said piezoelectric plates are not provided with electrodes, and an electric voltage is applied through said metal plates.

7. The piezoelectric laminate stack of claim 1, wherein:
   on each said metal plate, adjacent ones of said projections are each spaced less than 180° from one another about the periphery of such plate.

8. A piezoelectric stack body according to claim 1, wherein:
   tip portions of said projections extend in a circumferential direction so that said projections are L-shaped, said tip portions being aligned in respective said straight lines and connected to each other by respective metal ribbons extending along respective said straight lines.

9. A piezoelectric stack body according to claim 8, wherein:
   said metal ribbons are connected to respective said top portions by means of spot welds.

* * * * *